US006801034B2

(12) United States Patent
Brittain et al.

(10) Patent No.: US 6,801,034 B2
(45) Date of Patent: Oct. 5, 2004

(54) METHOD AND APPARATUS OF ACQUIRING LARGE FOV IMAGES WITHOUT SLAB-BOUNDARY ARTIFACTS

(75) Inventors: Jean Helen Brittain, Pewaukee, WI (US); John Mark Pauly, Redwood City, CA (US)

(73) Assignee: General Electric Company, Milwaukee, WI (US)

( * ) Notice: Subject to any disclaimer, the term of this patent is extended or adjusted under 35 U.S.C. 154(b) by 257 days.

(21) Appl. No.: 09/681,420

(22) Filed: Mar. 30, 2001

(65) Prior Publication Data

US 2002/0143247 A1 Oct. 3, 2002

(51) Int. Cl.⁷ .......................... G01V 3/00; G01R 33/28; A61B 5/55
(52) U.S. Cl. ..................... 324/309; 324/318; 600/425; 600/415
(58) Field of Search ............... 600/410, 422, 600/423, 415, 425; 324/318, 309, 307, 306, 300, 322

(56) References Cited

U.S. PATENT DOCUMENTS

| | | | | |
|---|---|---|---|---|
| 5,924,987 A | * | 7/1999 | Meaney et al. | 600/420 |
| 5,928,148 A | | 7/1999 | Wang et al. | |
| 6,230,040 B1 | * | 5/2001 | Wang et al. | 600/415 |
| 6,311,085 B1 | * | 10/2001 | Meaney et al. | 600/420 |
| 6,317,620 B1 | | 11/2001 | Ho et al. | |
| 6,445,181 B1 | * | 9/2002 | Pelc et al. | 324/307 |
| 6,493,571 B1 | * | 12/2002 | Bis et al. | 600/420 |
| 6,564,085 B2 | * | 5/2003 | Meaney et al. | 600/415 |
| 2002/0143247 A1 | * | 10/2002 | Brittain et al. | 600/410 |

FOREIGN PATENT DOCUMENTS

| | | | |
|---|---|---|---|
| EP | WO 98/46983 | * | 10/1998 |
| JP | 06304153 | | 1/1994 |
| JP | 06311977 | | 8/1994 |
| JP | 08173396 | | 9/1996 |

OTHER PUBLICATIONS

Moran, PR. A flow velocity zeugmatographic interface for NMR imaging in humans. Magnetic Resonance Imaging 1982; 1: 197–203.

Bryant DJ, Payne JA, Firmin DN, and Longmore DB. Measurement of flow with NMR imaging using a gradient pulse and phase difference technique. J Comput Assist Tomogr 1984; 8: 588–93.

Van Dijk P. Direct cardiact NMR imaging of heart wall and blood flow velocity. J. Comput Assist Tomogr 1984; 8: 429–36.

(List continued on next page.)

Primary Examiner—Diego Gutierrex
Assistant Examiner—Tiffany A. Fetzner
(74) Attorney, Agent, or Firm—Ziolkowski Patent Solutions Group, LLC; Michael A. Della Penna; Carl B. Horton (57) ABSTRACT

A system and method are disclosed using incremental table motion and partial data acquisition for increased volume coverage to reconstruct MR images across a large FOV without significant slab-boundary artifacts. At each table position, full z-encoding data are acquired for a subset of the $k_x$-$k_y$ data. The table is stepped through a number of positions over the desired FOV and MR data are acquired over the plurality of table increments. Since full z-data are acquired for each slab, the data can be Fourier transformed in z, sorted, and then aligned to match anatomic z locations. The fully sampled and aligned data is then Fourier transformed in x and y to reconstruct the final image that is free of slab-boundary artifacts.

37 Claims, 6 Drawing Sheets

OTHER PUBLICATIONS

Nayler GL, Firmin DN, and Longmore DB. Blood flow imaging by cine magnetic resonance. J Comput Assist Tomogr 1986; 10: 715–22.

Swan JS, Grist TM, Weber DM, Sproat IA, and Wojtowycz MM. MR angiography of the pelvis with variable velocity encoding and a phase–array coil. Radiology 1994; 190: 363–9.

Swan JS, Weber DM, Grist TM, Wojtowycz MM, Korosec FR, and Mistretta CA. Peripheral MR angiography with variable velocity encoding. Work in progress. Radiology 1992; 813–7.

Ehman RL, Felmiee JP. Adaptive technique for high definition MR imaging of moving structures. Radiology 1998; 173: 255–263.

Ho KY, Leiner T, de Haan MW, Kassels AG, Kitslaar PF, and van Engelshoven JM. Peripheral vasculature tree stenoses: evaluation with moving–bed infusion–tracking MR angiography. Radiology 1998; 20: 683–92.

Meaney JF, Ridgway JP, Chakraverty S, Robertson I, Kessel D, Radjenovic A, Kouwenhoven M, Kassner A, and Smith MA. Stepping–table gadolinium–enhanced digital subtraction MR angiography of the aorta and lower extremity arteries; preliminary experience. Radiology 1999; 211: 59–67.

Foo, TKF, Saranathan M, Prince MR, and Chenevert TL. Automated detection of bolus arrival and initiation of data acquisition in fast, three–dimensional, gadolinium–enhanced MR angiography. Radiology 1997; 203: 275–80.

Wilman AH, Riederer SJ, Huston J. $3^{rd}$ Wald JT, and Debbins JP. Arterial phase carotid and vertebral artery imaging in 3D contrast–enhanced MR angiography by combining fluoroscopic triggering with an elliptical centric acquisition order. Magn. Reson Med. 1998; 40: 24–35.

Riederer SJ, Fain SB, Kruger DG, and Busse RF. 3D–enhanced MR angiography using fluoroscopic triggering and an elliptical centric view order. Int. J. Card Imaging 1999; 15: 117–29.

Prince MR, Chenevert TL, Foo TKF, Londy FJ, Ward JS, Maki JH. Contrast enhanced abdominal MR angiography: Optimization of imaging delay time by automating the detection of contrast material arrival in the aorta. Radiology 1997; 203: 109–114.

Meany, Dr. James FM, Leeds General Infirmary, Leeds UK Moving Bed MRA, The Future of Peripheral Arteriography? Phillips.

Kouwenhoven, M., MRA with moving bed imaging, IX International Workshop on Magnetic Resonance Angiography and Introductory Course "New Horizons on MRA and CTA", Valencia, Oct. 7–11, 1997, Book of Abstracts, The MR Angio Club, p. 158.

Kruger, DG., Riederer, S.J., Grimm, R.C., Rossman, P.J., Continuously moving table data acquisition method for long FOV contrast–enhanced MRA and whole–body MRI. Magnetic Resonance in Medicine, 47: 224–231 (2002).

K. Liu, B. Rutt, "Sliding Interleaved ky (SLINKY) Acquisition: A Novel 3D MRA Technique with Suppressed Slab Boundary Artifact", JMRI, 8:903–911 (1998).

K. Liu, D. Lee, B. Rutt, "Systematic Assessment and Evaluation of Sliding Interleaved ky (SLINKY) Acquisition for 3D MRA", JMRI, 8:912–923 (1998).

K. Liu, "SLINKY: More Understanding, Optimization and Application for High Resolution MRA", ISMRM Seventh Scientific Meeting, 1908, 1999.

K. Liu, Y. Xu, M. Loncar, "Artifact Transformation Technique: Shifted Interleaved Multi–Volume Acquisition (SIMVA) for 3D FSE", ISMRM Sixth Scientific Meeting, 572, 1998.

K. Liu, Y. Xu, M. Loncar, "Applications of Shifted–Interleaved Multi–Volume Acquisition (SIMVA) with Suppressed Slab Boundary Artifact", ISMRM Seventh Scientific Meeting, 1618, 1999.

J. Hennig, "Overlapping Section Coverage in Multisection Imaging", JMRI, 3:425–432 (1993).

J. Pipe, "Spatial Encoding and Reconstruction in MRI with Quadratic Phase Profiles", MRM, 33:24–33 (1995).

J. Pipe, "Analysis of Localized Quadratic Encoding and Reconstruction", MRM, 36: 137–146 (1996).

O'Dietrich, J. Hajnal, "Extending the Coverage of True Volume Scans by Continuous Movement of the Subject", ISMRM Seventh Scientific Meeting, 1653, 1999.

K.Y. Ho, T. Leiner, M.H. de haan, J.M.A. van Engelshoven, "Gadolinium Optimized Tracking Technique: A new MRA technique for Imaging the Peripheral Vascular Tree from Aorta to the Foot using one Bolus of Gadolinium", ISMRM Fifth Scientific Meeting, 203, 1997.

* cited by examiner

METHOD AND APPARATUS OF ACQUIRING LARGE FOV IMAGES WITHOUT SLAB-BOUNDARY ARTIFACTS

BACKGROUND OF INVENTION

The present invention relates generally to an improved method of medical imaging over large areas, and more particularly, to a method and apparatus of acquiring magnetic resonance (MR) images over an area that is greater than the optimal imaging area of an MR scanner using step-wise movement of a table through the MR scanner without incurring slab-boundary artifacts.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

In such MRI systems, the volume for acquiring MR data with optimal gradient linearity, having a uniform magnetic field $B_0$, and uniform radio frequency (RF) homogeneity is of limited extent. Desired fields-of-view (FOV) that exceed this limited volume are traditionally acquired in sections, with table motion between scans. The resulting concatenated images often exhibit discontinuities at the slab junctions. These slab-boundary artifacts result in non-ideal images. When these artifacts are either severe or occur in a critical region-of-interest, complete re-acquisition of data may be needed for a thorough analysis.

It would therefore be desirable to have a new method and apparatus that allows coverage of large FOV without slab-boundary artifacts in the resulting concatenated images.

SUMMARY OF INVENTION

The present invention relates to a system and method of acquiring large FOV MR images using incremental table motion for increased volume coverage that results in reconstructed images without discontinuities.

Slab-boundary artifacts are eliminated in a 3D acquisition sequence by stepping an imaging object with respect to the optimal volume of the imaging apparatus, or vice versa. For example, stepping a moveable table in small increments and using a unique acquisition and reconstruction scheme. The thickness of the slab, which is smaller than the desired FOV, is selected to remain within the optimal volume of the MR system. The selected slab position remains fixed relative to the magnet of the MR scanner during the scan, and the table is moved in incremental steps during scanning of the entire FOV. MR data is acquired by applying an excitation that excites spins and applying magnetic field gradient waveforms to encode the volume of interest. The volume of interest is restricted in the direction of table motion. The magnetic field gradients traverse k-space following a trajectory that is uniform in the k-space dimension that is in the direction of table motion. The magnetic field gradient waveforms that encode the k-space directions perpendicular to table motion are divided into subsets. At each table position, all the k-space data in the direction of table motion are acquired for a subset of the remaining two k-space dimensions. After acquisition, data is transformed in the direction of table motion, sorted, and aligned to match anatomical locations in the direction of table motion. This procedure is repeated to fill the entire 3D matrix. A final image is reconstructed by transforming the data in the dimensions perpendicular to table motion. This stepped table approach provides reconstructed images absent of slab-boundary artifacts over large FOV imaging areas.

In accordance with one aspect of the invention, a method of imaging large volumes without resulting slab-boundary artifacts includes defining a desired FOV larger than an optimal imaging volume of an MR scanner and selecting a slab thickness in a first direction that is smaller than the desired FOV but that is within the optimal imaging volume of the MR scanner. MR data is then acquired by exciting and encoding spins to acquire data that is restricted to the selected slab thickness. The imaging area is then moved step-wise with respect to the imaging object using a step distance that is preferably a multiple of the image resolution in the direction of table motion. This process is repeated until the desired FOV is fully encoded using a series of cyclically repeated magnetic field gradient waveforms. Scan time can be minimized by applying time-varying magnetic field gradient waveforms during signal acquisition. The selected trajectory need only be uniform in the direction of motion. Artifacts are reduced by using stepped acquisitions as opposed to continuous motion acquisitions.

In accordance with another aspect of the invention, an MRI apparatus is disclosed to acquire multiple sets of MR data with a moving table and reconstruct MR images without slab-boundary artifacts that includes a magnetic resonance imaging system having an RF transceiver system and a plurality of gradient coils positioned about a bore of a magnet to impress a polarizing magnetic field. An RF switch is controlled by a pulse module to transmit and receive RF signals to and from an RF coil assembly to acquire MR data. A patient table is moveable fore and aft in the MR system about the magnetic bore to translate the patient so that an FOV larger than the optimal scanning area of the MRI system can be scanned. A computer is programmed to receive input defining a desired FOV larger than the optimal imaging volume of the MR system. The computer is also capable of defining a fixed slab with respect to the magnet to acquire the MR data therein. The computer then acquires full MR data in the direction of table motion for a subset of the data in the directions perpendicular to table motion, and then increments position of the patient table while maintaining the position of the fixed slab. The algorithm is repeated, collecting the necessary MR data across the defined FOV. To reconstruct the image, the MR data is first transformed in the direction of table motion, and then aligned to match anatomic locations across slab boundaries. Thereafter, the MR data is transformed with respect to the remaining two dimensions to reconstruct an MR image.

Yet another aspect of the invention includes a computer program having a set of instructions executed by a computer to control a medical imaging scanner and create images across scanning boundaries without significant boundary artifacts. The computer is caused to select an FOV spanning an area greater than a predefined optimal image area of the medical imaging scanner, apply an RF pulse to excite a region of interest, and apply magnetic field gradients to encode the region of interest in a first direction. The volume of interest is limited in the direction of table motion either by using a slab-selective RF pulse or by acquiring the data in such a way that an acquisition filter can be used to restrict the spatial extent. Three-dimensional image data can then be acquired in the first direction as a subset of a second and third direction for each table movement. The computer then causes a patient table to move an incremental step with respect to the medical imaging scanner, and repeat the image data acquisition in the first direction for he remaining two directions until sufficient data is acquired across the entire FOV. An image can be reconstructed without slab-boundary artifacts after aligning anatomical data in the first direction.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention. In the drawings.

DETAILED DESCRIPTION

Figure 1:
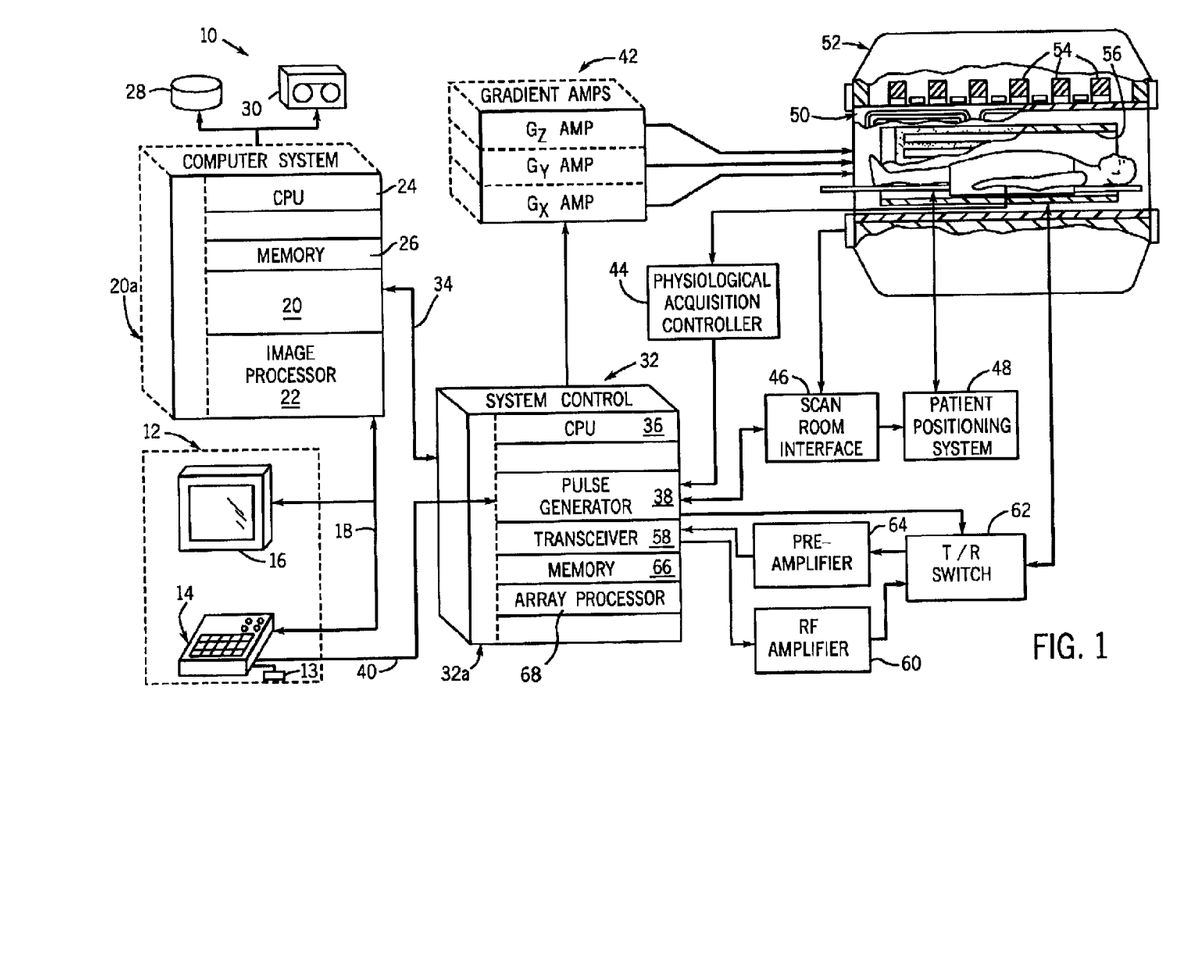
FIG. 1 is a schematic block diagram of an MR imaging system for use with the present invention.

Referring to FIG. 1, the major components of a preferred magnetic resonance imaging (MRT) system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the display 16. The computer system 20 includes a number of modules which communicate with each other. through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is processed as necessary and rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30 or any mass storage device, or it may be further processed by the image processor 22 and conveyed to the operator console 12 and presented on the display 16.

The present invention includes a method and system suitable for use with the above-referenced MRI system, or any similar or equivalent system for obtaining MR images. When used with a trajectory that is uniform in the direction of table motion, such as z, data acquired in sections to form large FOV 3D images can be acquired without significant slab-boundary artifacts.

As is known, in any MRI system, there is a limited spatial volume having optimal gradient linearity, uniform magnetic polarizing field $B_0$, and uniform RF homogeneity. Larger volumes are traditionally imaged in sections with table motion between scans that result in concatenated images that exhibit discontinuities at slab junctions. The present invention includes a 3D imaging technique that steps the table position in increments during the scanning procedure. In general, after defining the desired FOV, a slab thickness is selected to remain within the MRI system's optimal imaging volume. As a result, the slab thickness is also smaller than the desired spatial coverage. MR data is acquired by repeatedly applying an excitation that excites spins and applying magnetic field gradient waveforms to encode the volume of interest. Preferably, a z slab selective RF pulse is used to excite the volume of interest in the z-direction and a 3D k-space trajectory encodes the volume selected. Some example of 3D k-space trajectories include a 3D EPI k-space trajectory, a cylindrical-stack of EPI k-space trajectory, a stack-of-spirals k-space trajectory, a stack-of-TWIRL k-space trajectory, a stack-of-projection-reconstruction k-space trajectory, and a 3DFT k-space trajectory. More generally though, the spatial extent of the acquired data is restricted in the direction of motion using a method such as using a slab-selective RF pulse or by using an acquisition strategy that allows the acquisition filter to restrict the volume of interest. Therefore, in the examples shown and in a preferred embodiment, the direction of table motion is in the z-direction. However, as one skilled in the art will readily recognize, the x-y-z orientation is arbitrary and the invention is not so limited. In addition, in the example shown and in a preferred embodiment the table moves relative to the system. However, as one skilled in the art will readily recognize it is equivalent to have the system move relative to the subject and the invention is not so limited.

The table is moved to cover the desired FOV while the slab position remains fixed relative to the magnet in the MRI system. At each table position, full k-space data in the direction of table motion is acquired for a subset of the data in the other two dimensions by using one or a series of magnetic field gradient waveforms. In the preferred embodiment, at each table position, full $k_z$ data is acquired for a subset of $k_x$-$k_y$ by using a series of magnetic field gradient waveforms. Preferably, no data is acquired during table motion, but RF excitations and magnetic field gradient waveforms are continued to preserve a steady-state condition.

Figure 2:
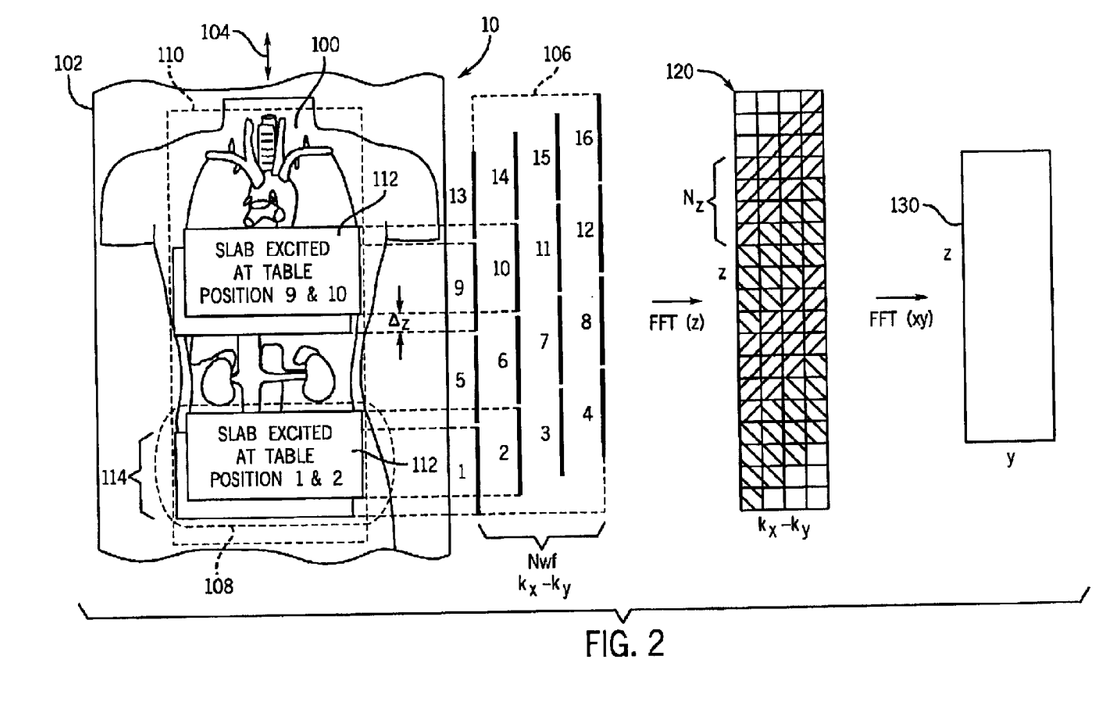
FIG. 2 is a diagram illustrating one embodiment of a data acquisition technique in accordance with the present invention.

Referring to FIG. 2, a data acquisition and processing technique, in accordance with the present invention, is shown schematically. FIG. 2 illustrates one embodiment of the present invention for acquiring data. In this embodiment, the table is step-wise incremented 15 times with data acquisitions 106 in 16 table positions along the desired FOV. Each of the table increments are of equal distance $\Delta_z$. A patient 100 is positioned on a moveable table 102, which moves fore and aft 104 within the MRT scanner 10 with respect to the magnet and the optimal imaging area 108 of the MRI scanner. The desired FOV 110 is substantially larger than the optimal imaging area 108, which is generally. larger than a selected slab thickness 112. As previously discussed, the table motion in this simplified example is in the z direction. Magnetic field gradient waveforms arc designed to encode four $k_z$-$k_y$ subsets ($N_{wf}$=4) with a total of 16 table positions and data acquisition sets 106. At each table position 1–16, there are four data acquisitions encoding four $k_z$ levels that result in four z-pixels in die excited slab after Fourier transformation in the z direction ($N_z$=4). $N_z$ and the retained slab thickness may be reduced slightly after acquisition if edge slices are dropped from each 2-$k_z$-$k_y$ data set to minimize the effect of imperfections in the slab profile. It is understood that the optimal imaging area 108 is defined by the physical characteristics of the MRI system 10. It is preferred to define a volume of interest, or slab, 114 to be within the optimal imaging area 108.

It is Doted that when $N_z$=$N_{wf}$, each of the table increments throughout the desired FOV 110 arc of equal distance. Accordingly, any of the aforementioned parameters con be adjusted as desired. That is, the slab thickness, 112 may be made larger or smaller, or the number of table positions and data acquisition sets 106 can be increased or decreased, above or below the 16 that are shown. The minimum number of table positions desired to reconstruct an image is equal to the number of waveform subsets, $N_{wf}$. Additionally, the number of z-pixels, $N_z$, retained in each excited slab, as well as the number of $k_x$-$k_y$ subsets can be modified as desired. Preferably however, $N_z$ is kept greater than or equal to $N_{wf}$. One such modification will be described with reference to FIG. 3.

Still referring to FIG. 2, it is noted that each table position 1–16, includes complete sampling in the direction of table motion which in this case is the z-direction, for a subset of the $k_x$-$k_y$ data, or more generally, in the directions perpendicular to the direction of table motion. Accordingly, either after all the data at each table position is acquired, or after all the data is acquired for a complete image, the data is Fourier transformed in the direction of table motion, in this case in the z direction, FFT(z), to form an array of z-$k_x$-$k_y$ data 120. The patient table 102 is moved in steps until the entire FOV 110 is covered. As indicated, at each table position, full z-encoding data, or encoding data in the direction of table motion, is acquired for a subset of the $k_x$-$k_y$ data, which are the two directions perpendicular to the table motion. While no data is acquired while the table is moving, it is desirable to continue the RF excitations and magnetic field gradient waveforms to preserve the steady-state condition. Further, it is desirable that over-sampling of MR data in a first direction, such as z-direction, is avoided.

After Fourier transforming with respect to z, or the direction of table motion, data acquired at different table positions are then sorted and aligned to match anatomic z locations, thereby filling the z-$k_x$-$k_y$ space. In general, the table step distances are multiples of the z-resolution and are selected to ensure complete sampling of the z-$k_x k_y$ matrix. As previously indicated, after the acquired data are Fourier transformed with respect to z, data at the slab edges can be dropped as required by imperfections in the slab-select profile. A final reconstructed image 130 is formed by gridding, if necessary, and Fourier transforming the fully sampled data array 120 with respect to x and y.

For complete sampling, the number of z-pixels retained, $N_z$, must be at least equal to the number of $k_x$-$k_y$ waveform subsets, $N_{wf}$. However, referring to FIG. 3, which also illustrates a simple example assuming table motion in the z direction, increasing the slab thickness 132 while maintaining the z resolution results in an increase in the number of z-pixels, N that are encoded at each table position. In this example, $N_z$=8 for 4 $k_x$-$k_y$ subsets ($N_{wf}$=4). Because $N_z$ is greater than $N_{wf}$, the table increments are not all equal, as shown in FIG. 2. That is, the distance between table positions 1, 2, 3, and 4, is less than that between table positions 4 and table position 5. Therefore, using a thicker slab, fewer movements of the table are required for the same spatial coverage. This results in an overall faster acquisition for the same size FOV, as compared to that in FIG. 2, if the time to initiate table motion is long relative to the time for a single acquisition. Even though increasing the slab thickness, $N_z$, incrementally increases individual acquisition time for each slab, the total scan time decreases because the time to initiate table motion dominates. Thus, in the case when the time to initiate table motion is long relative to the time for a single acquisition, scan time is minimized by minimizing the number of table movements. With current equipment, it typically takes approximately one second to initiate table motion. While reducing this time is the long-term desired solution, it is not practical in the short term since it requires significant changes to the system architecture.

Figure 3:
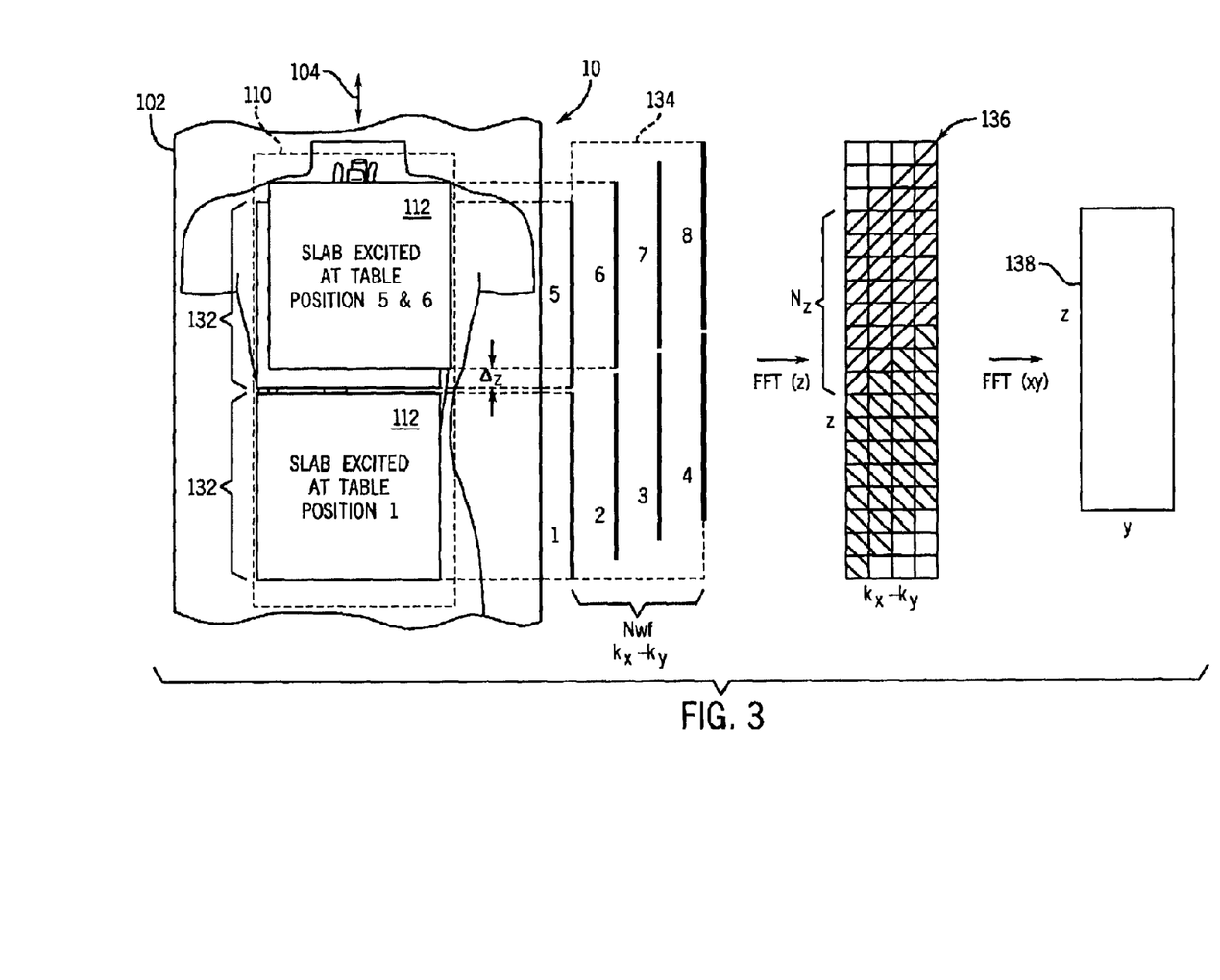
FIG. 3 is a diagram similar to FIG. 2, illustrating another embodiment for data acquisition in accordance with the present invention.

Still referring to FIG. 3, after step-wise translating the patient table through the entire FOV 110 and acquiring data set 134, the data is Fourier transformed with respect to z to obtain a $z$-$k_x$-$k_y$ data set 136. The data acquired at different table positions can then be sorted and aligned to match anatomic z locations. A final image 138 is reconstructed by again first gridding, if necessary, and then Fourier transforming the fully sampled data with respect to x and y, FFT (xy).

To generalize, the table step distances are multiples of the pixel size in the direction of table motion and are selected to ensure complete sampling of the 3D matrix. The number of table steps required depends on the relative number of pixels retained in the excited slab, $N_z$, for the case of motion in the z direction, and the number of magnetic field gradient waveform subsets required to fully encode the dimensions perpendicular to table motion, $N_{wf}$. As previously indicated, for complete sampling, $N_z$ should be at least equal to $N_{wf}$. However, if $N_z$ is greater than $N_{wf}$, faster overall scan times are achievable. It is noted that the subsets of magnetic field gradient waveforms, $(g_x, g_y)$ are defined by one or a series of such waveforms that differ between subsets. This set, or series, of magnetic field gradient waveforms, that encode the $k_x$, $k_y$ subsets, are then repeated in a cyclic manner to obtain the data sets 106, FIG. 2, and 134, FIG. 3.

The present technique can be used with any 3D k-space trajectory that is uniform in the direction of table motion. In one embodiment implemented on a system with table motion in the z direction, a cylindrical stack of EPI trajectory (CSEPI) sequence was utilized that phase encodes in $k_z$ between planes of interleaved EPI waveforms that are clipped to a circle in $k_x$-$k_y$. The data is gridded before Fourier transformation in x and y. The waveforms were designed with $G_{max}$=22 mT/m and a slew rate of 120 mT/m/ms. Since k-space data for a single anatomic location is being compiled from data collected at different table positions, any variation in phase or amplitude in the direction of table motion will result in image artifacts. To minimize such artifacts, one embodiment uses a linear phase slab-select RF pulse with sharp transitions and low in-slice ripple, for example 0.5%, and drops one slice at each slab edge. Frequency variations in the direction of table motion that result from magnetic field inhomogeneity are demodulated during reconstruction. Further, decreasing the slab thickness also decreases the sensitivity to such variations.

Figure 4:
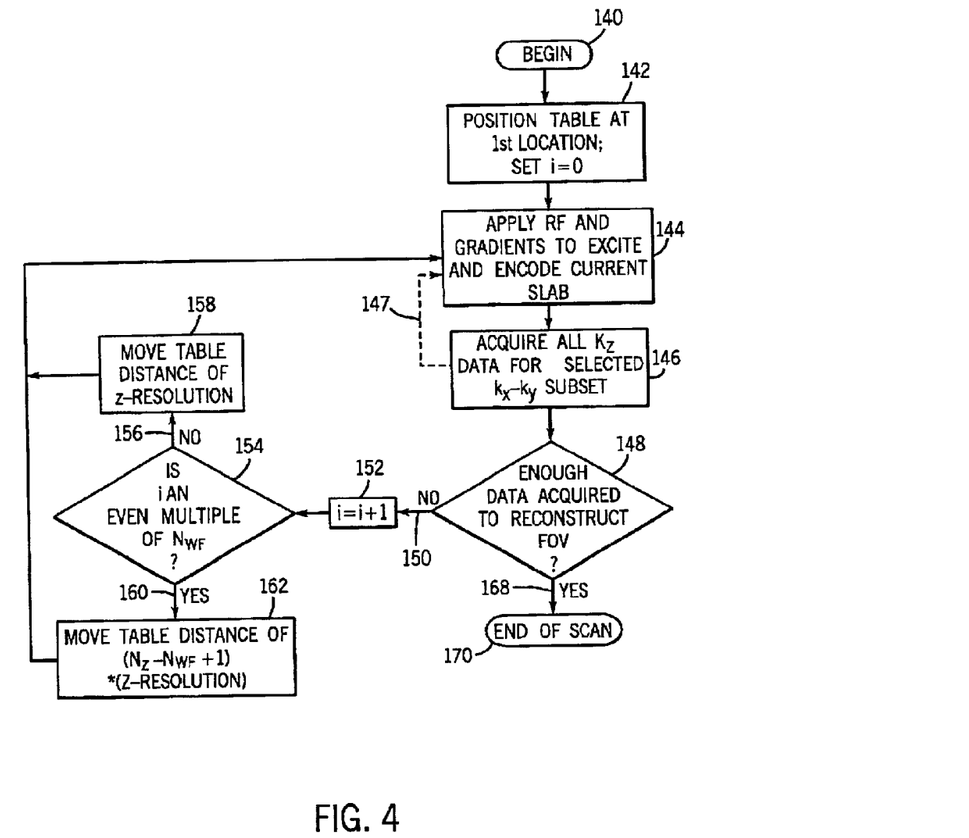
FIG. 4 is a flow chart demonstrating a data acquisition algorithm for use with that shown in FIGS. 2 and 3.

FIG. 4 is a flow chart for a data acquisition sequence in accordance with the techniques of FIGS. 2 and 3. After the data acquisition sequence is initialized 140, the table is positioned at the first location of the desired FOV and a variable i is initialized 142. MR data is acquired by repeatedly exciting spins using an RF pulse and applying magnetic field gradient waveforms to encode the volume of interest 144. Assuming table motion in the z-direction, all $k_z$ data are acquired for the selected $k_x$-$k_y$ subset, that are in the dimensions perpendicular to table motion 146. The spatial extent in the direction of table motion is restricted using a restriction method such as either a slab-selective RF excitation or by acquiring data in such a way that the acquisition filter can be used to restrict the slab thickness. It is noted that for phase encoding in the direction of table motion the RF pulse is repeatedly applied prior to each acquisition 147 until all $k_z$ data is acquired 146. For readout in the direction of table motion, each RF pulse is applied at 144 followed by acquisition of complete $k_z$ data for the selected $k_x$-$k_y$ subset 146. As long as the end of the FOV is not reached 148, 150, the variable i is incremented 152 and the system checks whether a complete set of magnetic gradient field waveform subsets has been acquired 154. That is, as long as the variable i is not an even multiple of $N_{wf}$ 154, 156, the table is moved a distance equal to the resolution in the direction of table motion 158, and the next slab becomes the current slab at 144 and data is again acquired at 146. After a complete series of subsets have been acquired 154, 160, the system determines if the next table increment is in accordance to that described with reference to FIG. 2 or FIG. 3. That is, if the number of magnetic gradient field waveforms is equal to the number of pixels retained in the slab in the direction of table motion ($N_{wf}$=$N_z$), the table is moved a distance equal to the z-resolution, or in the direction of table motion 162, as in FIG. 2, and the data acquisition sequence continues 144, 146. Otherwise, where $N_z$ is greater than $N_{wf}$ 162, such as in FIG. 3, the table is moved a distance according to:

$$(N_z-N_{wf}+1) \times (z\text{-resolution}), \qquad \text{Eqn. 1.}$$

and data is again acquired for the new slab 144, 146, until all the slabs have been scanned across the FOV 148, 168 which completes the scan at 170. Again, the direction of table motion is arbitrarily chosen and represented as a z-direction. However, the invention is not so limited. As one will readily recognize, the assignment of any character set can be used to represent a three dimensional axis.

It is noted that at each table position such as the acquisition at table position 1 in FIGS. 2 and 3, unique magnetic gradient waveforms or a set of waveforms on the gradient axes perpendicular to the direction of table motion (transverse waveforms) are applied in conjunction with the gradient waveform or waveforms required to acquire a complete set of data in the direction of table motion. At table positions 2, 3, and 4, different magnetic gradient field waveforms or sets of waveforms are applied on the axes perpendicular to the direction of table motion. The next series of table positions, 5–8, FIGS. 2 and 3, use the same magnetic field gradient waveforms as in the data acquisitions 1–4. Therefore, the variable i is used to also increment the application of the proper magnetic field gradient waveforms for the series, and when a series is complete, the same waveforms are recycled in the next series.

Figure 5:
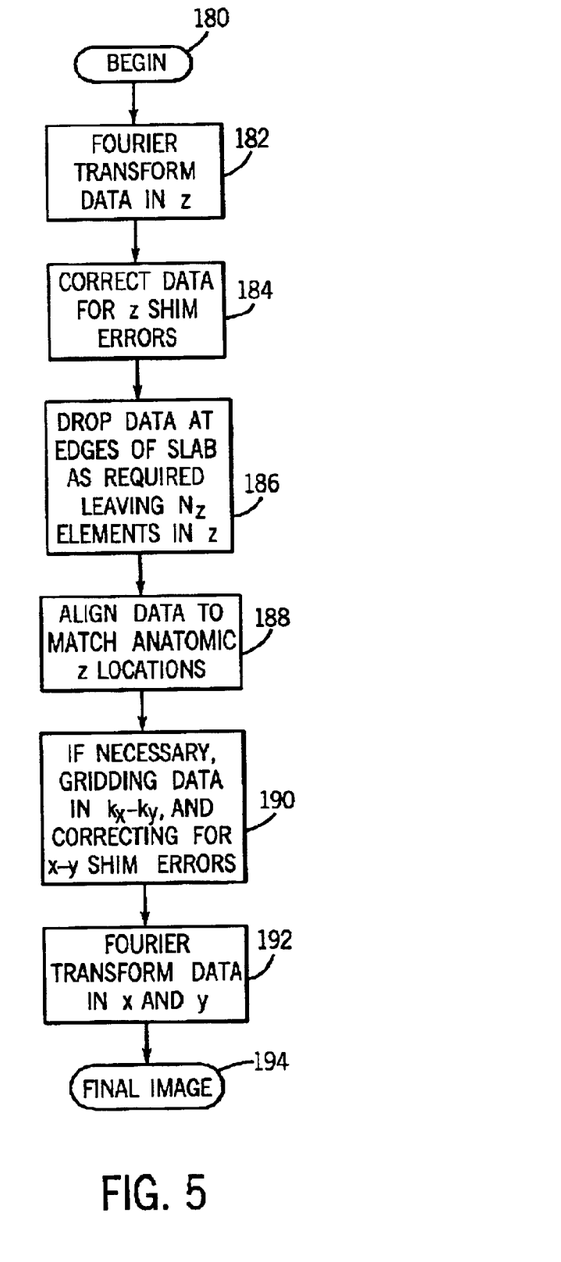
FIG. 5 is a flow chart showing the data processing steps employed either during or after the data acquisition of FIG. 4.

Referring now to FIG. 5, a data processing scheme in accordance with the present invention is shown in flow chart form. Once initiated 180, which can either be as data is being acquired on-the-fly, or after all data has been acquired, the MR data is Fourier transformed in the direction of table motion, z in this case, at 182, and if necessary, the data is corrected for shim errors in that direction 184. After Fourier transformation, the data at the edge boundaries of the slab are discarded as required 186, which results in $N_z$ data elements in the direction of table motion. The data is then aligned to match anatomic locations at 188 and then, if necessary, the data may be gridded and corrected for shim errors in the remaining two directions at 190. The data is then Fourier transformed in the transverse dimensions at 192 to reconstruct the final image 194.

Figure 6:
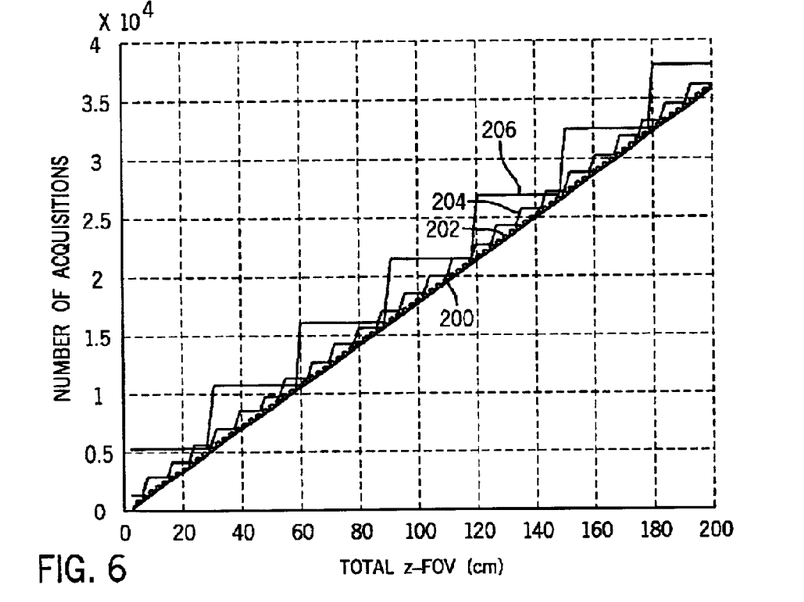
FIG. 6 is a plot of a number of acquisitions versus total z-FOV for four values of slab thickness.
Figure 7:
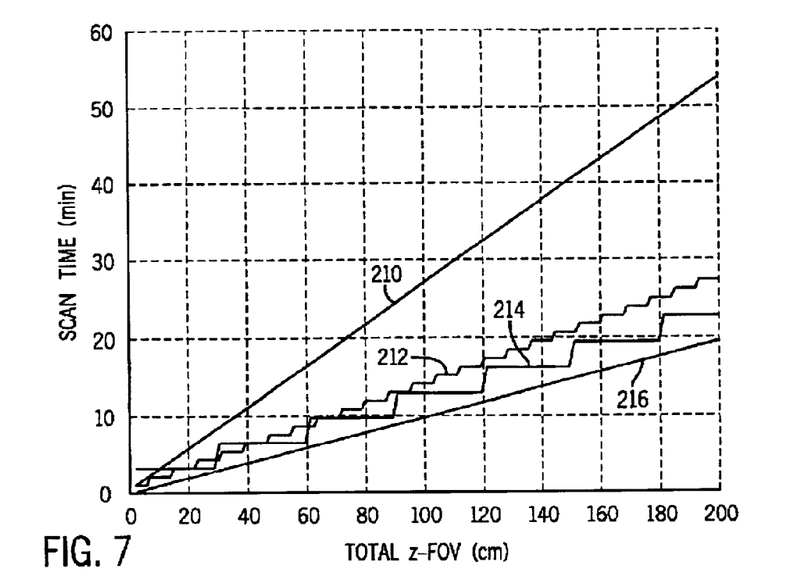
FIG. 7 is a plot of total scan time versus total z-FOV for the four values of slab thickness plotted in FIG. 6.

FIG. 6 is a graph plotting a number of acquisitions versus total FOV in the direction of table motion for three values of slab thickness and a single acquisition. In this exemplary acquisition having 18 transverse magnetic field gradient subsets and 1 mm resolution in the direction of table motion, the baseline 200 represents a single acquisition (i.e., no table movement), with the entire FOV acquired as a single large volume. The rippled line 202 shows the acquisition for a 1.8 cm slab, while the next plot 204 shows that for an 8 cm slab, and the largest stepped plot 206 is that for a 30 cm slab. Referring to FIG. 7, the total scan time for each of the acquisitions of FIG. 6 are shown plotted against total FOV in the direction of table motion in centimeters. Plot 210 corresponds to the 1.8 cm. slab acquisition, which took the longest total time because of the many table movements, while plot 216 is that of the single acquisition, which was the fastest. Between plots 210 and 216, the acquisition times for the 8 cm slab are shown by plot 212 and the 30 cm slab by plot 214. Each of these acquisitions assumes 32 ms for each repetition of excitation plus acquisition of encoded data and one-second for each table movement. In this example, where the time to initiate table motion is long relative to the time required for a single acquisition, it is evident that the larger the slab thickness, the faster the scan times that can be achieved since fewer table motions are required.

Accordingly, the present invention includes a method of imaging large volumes without resulting slab-boundary artifacts that includes defining a desired FOV larger than an optimal imaging volume of an MR scanner, selecting a slab thickness in a first direction that is smaller than the desired FOV, but within the optimal imaging volume of the MR scanner, then exciting and encoding spins to acquire data that is restricted to the selected slab thickness. MR data is acquired that includes full encoding data in the direction of table motion for a subset of another two directions, then step-wise moving one of the optimal imaging volume and an imaging object to acquire another set of MR data. This process of acquiring sets of MR data and step-wise moving the table is repeated until the desired FOV is covered. In a preferred embodiment, each MR data acquisition includes acquiring all k-space data in the direction of table motion for a selected subset of the two transverse dimensions, and further includes defining a set or series of magnetic field gradient waveforms that encode a 3D k-space trajectory that is uniform in a k-space dimension along the direction of step-wise movement.

The invention also includes an MRI apparatus, such as that disclosed with reference to FIG. 1, having a patient table moveable fore and aft in the MRI system within the magnet and a computer programmed to receive input defining a desired FOV larger than an optimal imaging volume of the MRI system. The MRI system comprises a plurality of gradient coils positioned about a bore of a magnet to impress a polarizing magnetic field, and an RF transceiver system and an RF switch controlled by a pulse module to transmit RF signals to an RF coil assembly to acquire MR images. The computer is programmed to define a fixed slab with respect to the magnet to acquire MR data and acquire full MR data in the direction of table motion for a selected subset of data in the directions perpendicular to the direction of table motion. The patient table is incremented while maintaining position of the fixed slab, and the system is further programmed to repeat the acquisition and increment steps until an MR data set is acquired across the desired FOV that is sufficient to reconstruct an image of the FOV.

Additionally, the present invention also includes a computer program to control a medical image scanner and create images across scanning boundaries without boundary artifacts. The computer program has a set of instructions to control a computer to select an FOV spanning an area greater than a predefined optimal imaging area of the medical image scanner and acquire MR data by repeatedly applying an RF pulse to excite a region in the selected FOV and magnetic field gradients to encode the region in a direction. The instructions further control the computer to apply a k-space trajectory to encode the region in the direction of table motion and acquire data for a subset of a second and third direction. The computer program includes instructions to reposition the predefined optimal imaging area with respect to an imaging object and repeat the image data acquisition and the imaging area incremental reposition until complete image data are acquired across the entire FOV to reconstruct an image of the FOV.

The present invention results in images that are free of slab-boundary artifacts and allows spatial coverage that is limited only by the range of table motion. Using thicker slabs, with unequal table steps, reduces the scan time for systems in which the time to initiate table motion is long relative to the time required for a single data acquisition. Applying time-varying magnetic field gradients during signal acquisition can further reduce scan times.

The present invention has been described in terms of the preferred embodiment, and it is recognized that equivalents, alternatives, and modifications aside from those expressly stated, are possible and within the scope of the appending claims.

What is claimed is:

1. A method of imaging large volumes without resulting slab-boundary artifacts comprising:

defining a desired FOV larger than an optimal imaging volume of an MR scanner;

selecting a slab thickness in a first direction that is smaller than the desired FOV anal within the optimal imaging volume of the MR scanner;

exciting and encoding spins to acquire data that is restricted to the selected slab thickness;

acquiring a set of MR data that includes acquiring full encoding data in the first direction for a subset of another two directions;

step-wise moving one of the optimal imaging volume and an imaging object; and acquiring another set of the MR data between each step-wise movement until the desired FOV is imaged.

2. The method of claim 1 wherein the step of exciting and encoding spins is further defined as restricting excitation to the slab thickness such that data acquisition is restricted to the selected slab thickness.

3. The method of claim 1 wherein the step of exciting and encoding spins is further defined as restricting data acquisition by encoding and filtering data so as to acquire data that is limited to the selected slab thickness.

4. The method of claim 1 wherein the first direction is in a direction of the step-wise movement and is defined as in a z-direction and a number of image pixels obtained within the selected slab thickness in the z-direction is at least equal to a number of $k_x$-$k_y$ subsets.

5. The method of claim 1 wherein MR data acquisition between step-wise movements includes acquiring all k-space data in a direction of motion of a patient table for a selected subset of k-space data in the other two directions.

6. The method of claim 1 further comprising continuing to apply the slab-selective RF pulse during table movement to maintain a steady-state.

7. The method of claim 1 wherein over-sampling of MR data in the first direction is avoided.

8. The method of claim 1 further comprising applying magnetic field gradients that encode a 3D k-space trajectory that is uniform in a k-space dimension along the step-wise movement ($k_z$).

9. The method of claim 8 wherein the 3D k-space trajectory has time-varying waveforms during MR data acquisition to minimize overall scan time.

10. The method of claim 8 wherein the 3D k-space trajectory is one of a 3D EPI k-space trajectory, a cylindrical-stack of EPI k-space trajectory, a stack-of-spirals k-space trajectory, a stack-of-TWIRL k-space trajectory, a stack-of-projection-reconstruction k-space trajectory, and a 3DFT k-space trajectory.

11. The method of claim 1 further comprising the step of maintaining a position of the slab thickness fixed relative to a magnet of the MR system during imaging of the desired FOV and the step-wise moving of a table.

12. The method of claim 1 further comprising selecting a distance of the step-wise movement as an integer multiple of an image resolution in the first direction.

13. The method of claim 2 further comprising applying a slab-selective RF pulse to restrict the excitation, the slab-selective RF pulse having linear phase, sharp transitions, and low in-slice ripple to reduce image artifacts from z-dependent variations in phase and amplitude.

14. The method of claim 1 further comprising selecting the step-wise movement distances to acquire complete MR data in each direction.

15. The method of claim 1 further comprising:
transforming MR data in a z-direction;
sorting and aligning the transformed MR data to match anatomic locations in the first direction so fill a $z$-$k_x$-$k_y$ space matrix.

16. The method of claim 15 further comprising reconstructing an MR image by transforming the z-transformed MR data in x and y.

17. The method of claim 15 further comprising gridding the MR data to reconstruct an MR image.

18. An MRI apparatus to acquire multiple sets of MR data with a moving table and reconstruct MR images without slab-boundary artifacts comprising:
a magnetic resonance imaging (MRI) system having a plurality of gradient coils positioned about a bore of a magnet to impress a polarizing magnetic field, and an RF transceiver system and an FR switch controlled by a pulse module to transmit RF signals to an RF coil assembly to acquire MR images;
a patient table movable fore and aft in the MRI system about the magnet bore; and
a computer programmed to:
receive input defining a desired FOV larger than an optimal imaging volume of the MRI system;
define a fixed slab with respect to the magnet to acquire MR data;
acquire full MR data in a direction of table motion, defined as z-direction, for a selected $k_x$-$k_y$ subset in the fixed slab;
increment the patient table while maintaining position of the fixed slab; and
repeat the acquire and increment acts until an MR data set is acquired across the desired FOV to reconstruct an image of the FOV.

19. The MRI apparatus of claim 18 wherein the computer is further programmed to transmit magnetic gradient waveforms to encode a 3D k-space trajectory that is uniform in $k_z$ and wherein a number of patient table increments with distances that are a multiple of a z-resolution are selected to ensure complete sampling of central $z$-$k_x$-$k_y$ matrix data.

20. The MRI apparatus of claim 18 wherein the computer is further programmed to:
transform MR data with respect to z;
align the z-transformed MR data to match anatomy across slab boundaries; and
transform the z-transformed MR data with respect to x and y to reconstruct an MR image.

21. The MRI apparatus of claim 18 wherein the computer is further programmed to:
apply a slab-selective RF pulse to excite a volume of interest in the z-direction;
apply a 3D k-space trajectory to encode the volume interest; and
wherein the MR data acquired in the z-direction has a number of pixels that are at least equal to a number of $k_x$-$k_y$ subsets.

22. The MRI apparatus of claim 18 wherein the computer is further programmed to:
apply an RF pulse to excite a volume of interest;
apply a 3D k-space trajectory to encode the volume of interest;
filter the acquired MR data to restrict the MR data to the defined fixed slab; and
wherein the MR data acquired in the z-direction has a number of pixels that are at least equal to a number of $k_x$-$k_y$ subsets.

23. The MRI apparatus of claim 18 wherein the computer is further programmed to continue to apply an RF pulse during table movement.

24. The MRI apparatus of claim 18 wherein the computer is further programmed to select patient table increments as an integer multiple of a desired z-resolution.

25. The MRI apparatus of claim 18 wherein the computer is further programmed to increment the patient table in steps having a distance that is a multiple of a z-resolution.

26. The MRI apparatus of claim 18 wherein the computer is further programmed to:
acquire all $k_x$ data for a selected $k_x$-$k_y$ subset;
define a set of magnetic field gradient waveforms to incrementally encode and acquire $k_z$-$k_x$-$k_y$ data in a given slab; and
apply the set of magnetic field gradient waveforms in a cyclic order.

27. The MRI apparatus of claim 25 wherein the computer is further programmed to:
transform MR data in z;
sort and align the z-transformed MR data to match anatomic locations with respect to z to fill a $z$-$k_x$-$k_y$ space matrix; and
reconstruct an MR image by transforming the aligned MR data in x and y.

28. A computer program to control a medical image scanner and create images across scanning boundaries without boundary artifacts, the computer program having a set of instructions to control a computer to:
select an FOV spanning an area greater than a predefined optimal imaging area of the medical image scanner;
apply an RF pulse to excite a region in at least a first direction in the selected FOV;

apply magnetic field gradients to encode the region in the first direction;

acquire 3D k-space data in the first direction for a subset of a second and third direction;

reposition the predefined optimal imaging area, with respect to an imaging object, an incremental step;

repeat data acquisition and the imaging area incremental reposition until complete image data are acquired across the entire FOV to reconstruct an image of the FOV.

29. The computer program of claim 28 wherein the incremental repositioning of the imaging area includes having further instructions to move a patient table a fixed distance to acquire additional k-space data.

30. The computer program of claim 28 having further instructions to:

move a patient table a fixed distance for a number of acquisitions until a set of k-space data are acquired for 3D image reconstruction of a given slab;

move the patient table a greater distance than the fixed distance;

repeat the act of image data acquisition for a second slab; and move the patient table the fixed distance for the same number of acquisitions as for the first slab until a set of image data are acquired for 3D image reconstruction.

31. The computer program of claim 28 wherein the 3D k-space data includes MR data, and having further instructions to:

Fourier transform MR data in z;

sort and align the z-transformed MR data to match anatomic locations in z to fill a z-$k_x$-$k_y$ space matrix.

32. The computer program of claim 28 wherein the 3D k-space data is acquired in z for a subset of $k_x$-$k_y$, and wherein the 3D k-space data acquired in z has a number of pixels that is at least equal to a number of $k_x k_y$ subsets.

33. The computer program of claim 28 having further instructions to move a patient table in incremental step distances that is a multiple of a z-resolution.

34. The computer program of claim 28 having further instructions to maintain a position of a slab thickness fixed, relative to a magnet of the medical image scanner, during the imaging of the desired FOV and while repositioning the imaging area.

35. The computer program of claim 28 wherein the RF pulse is a slab-selective RF pulse having linear phase, sharp transitions, and minimum in-slice ripple to reduce image ghosting from z-dependent variations in phase and amplitude.

36. The computer program of claim 28 wherein the first direction is a z-direction and the 3D k-space data includes MR data, and the MR data acquired in the z-direction is represented in a number of retained pixels, the number of which is greater than a number of $k_x$-$k_y$ subsets, and wherein the RF pulse is continually applied to maintain a steady-state but where MR data is not acquired during table movement, and wherein the magnetic field gradients encode a 3D trajectory that is uniform in $k_z$.

37. The computer program of claim 28 having further instructions to:

acquire all $k_z$ data for a selected $k_x$-$k_y$ subset;

define a set of magnetic field gradient waveforms to incrementally acquire $k_z$-$k_x$-$k_y$ data in each slab; and apply the set of magnetic field gradient waveforms over each slab.

* * * * *

UNITED STATES PATENT AND TRADEMARK OFFICE
CERTIFICATE OF CORRECTION

PATENT NO. : 6,801,034 B2 Page 1 of 1
DATED : October 5, 2004
INVENTOR(S) : Brittain et al.

It is certified that error appears in the above-identified patent and that said Letters Patent is hereby corrected as shown below:

Column 11,
Line 50, delete "FR" and substitute therefor -- RF --.

Signed and Sealed this

Eighteenth Day of January, 2005

JON W. DUDAS
*Director of the United States Patent and Trademark Office*